United States Patent [19]

Beaudet

[11] 4,193,051
[45] Mar. 11, 1980

[54] MAGNETOSTRICTIVE MECHANICAL FILTER

[75] Inventor: Didier M. Beaudet, Saint-Maur-des-Fosses, France

[73] Assignee: Societe Anonyme de Telecommunications, France

[21] Appl. No.: 907,779

[22] Filed: May 19, 1978

[30] Foreign Application Priority Data

May 26, 1977 [FR] France ................................ 77 16140

[51] Int. Cl.² ............................................. H03H 7/10
[52] U.S. Cl. ..................................... 333/201; 333/185
[58] Field of Search ............... 333/185, 186, 197, 201; 310/26; 336/196, 197, 198

[56] References Cited

U.S. PATENT DOCUMENTS

| 2,891,178 | 6/1959 | Elmore | 333/201 |
| 2,891,179 | 6/1959 | Elmore | 333/201 |
| 2,891,180 | 6/1959 | Elmore | 333/201 |

Primary Examiner—Alfred E. Smith
Assistant Examiner—Robert E. Wise
Attorney, Agent, or Firm—Jacobs & Jacobs

[57] ABSTRACT

A magnetostrictive mechanical filter comprising at least one rod of a magnetostrictive material forming a resonance element, a spool surrounding the rod, a field coil the windings of which are wound around the spool, and magnets creating a continuous magnetic field, arranged respectively at the ends of the rod, the rod being held radially in at least three points disposed regularly about the rod in the vicinity of the middle portion thereof, a rib being provided at each fixation point, said rib extending parallel to the generatrices of the rod and being formed on the inner peripheral surface of the spool and integrally molded with said spool.

4 Claims, 4 Drawing Figures

MAGNETOSTRICTIVE MECHANICAL FILTER

The present invention relates to a mechanical filter utilizing the magnetostriction effect.

Such a filter comprises substantially a magnetostrictive rod, for example of ferrite, forming a resonant element, which is placed in an excitation magnetic field, the whole assembly being subjected to a continuous magnetic field. Such a rod is arranged in such manner that it is possible to collect its longitudinal vibrations. It is known that the proper resonance frequency of a freely vibrating rod is expressed by the formula $f=(V/2L)$ where V is the propagation velocity of sound in the considered material, and L is the length of the rod.

Several embodiments of such a mechanical filter have already been described. For instance, French Pat. No. 1 132 665 discloses a magnetostrictive rod surrounded by a field coil placed in a continuous field generated by two ferrite permanent magnets disposed at the ends of the rod and being in the form of washers of ferrite. The whole is usually surrounded by a sleeve of ferrite in order to focus the lines of force of the magnetic field. The means provided according to this reference for positioning the rod comprises a washer engaging in a slot formed halfway of the rod and bearing outwardly on the ferrite sleeve.

However, with such securing means, the magnetostrictive filter cannot be provided with stable characteristics since the axis of the rod may be displaced relative to the normal to the washer plane. Any movement of the rod relative to the permanent magnets generates a dissymmetry of the attraction forces and the rod thus presents a tendency to leave the symmetry plane between the magnets. It is therefore very important to provide the rod with securing means which do not disturb its resonance frequency, that is which hold it in position relative to the permanent magnets.

The German Pat. No. 1 079 696 provides for the fixation of the rod a washer which is not fixedly attached to the spool supporting the coil windings. Such a washer is placed at the center of the rod and maintains same at three points through three projections formed on its inner periphery. A three point fixation in the knot plane of the rod is also described in Belgium Pat. No. 509 946.

But such a known arrangement is not satisfactory since it does not avoid the hereabove mentioned disadvantage of allowing a pivoting motion of the rod.

The problem arising is therefore to provide a satisfactory holding in position of the rod while limiting to the maximum the contact surface between the rod and the holding elements, in order to avoid an excessive drop of the overvoltage coefficient.

According to the invention there is provided as holding elements at least three ribs integrally formed with the spool supporting the coil windings and extending parallel to the generatrices of the rod and disposed regularly about said rod.

The invention will become more apparent from the following description when taken in conjunction with the accompanying drawing wherein.

Figure 1:
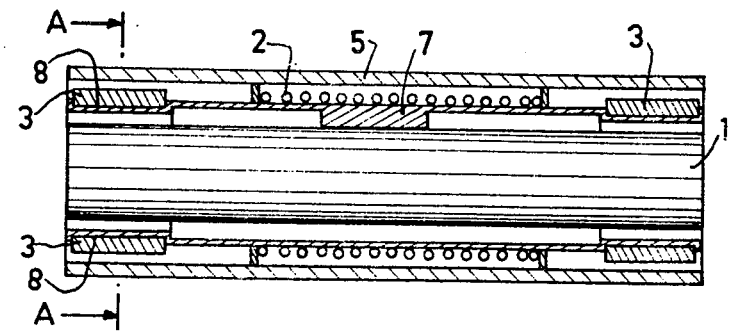
FIG. 1 is a general representation of the filter as seen in a longitudinal cross-section.

FIG. 1 shows a rod of cylindrical shape, of circular cross-section, made of a magnetostrictive material such as ferrite. Rod 1 is surrounded by a field coil 2 acting as an excitation coil the windings of which are wound about a spool formed by an insulating tube 6, for instance of plastics material, the windings being retained on both sides by washers 9 molded on spool 6. The length L of the rod is large relative to its diameter, about 8 times superior in the example shown. A continuous magnetic field can be created inside the rod by means of a coil through which flows a continuous current or again by permanent magnets 3 and 4 as is shown in FIG. 1, disposed at both ends of rod 1. These magnets may be for instance in the form of washers, rings, sectors or, as is shown, rectangular parallelepipeds. The magnets are of opposed polarity in pairs. They may be of ferrite or cobalt-samarium. Finally, an outer sleeve 5, of ferrite, for instance of cylindrical shape, is placed around the whole so as to close the flux and guide the lines of force between the two permanent magnets 3 and 4.

The rod, in order to vibrate according to its proper frequency, must have a well determined position relative to the permanent magnets gap, and its ends must not contact the spool supporting the excitation coil. But the smallest displacement of the rod generates a dissymmetry of the attraction forces and the rod has a natural tendency to depart from the symmetry plane of the filter.

Figure 2:
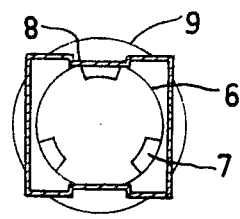
FIG. 2 is a cross-sectional view along line A—A' of FIG. 1.

The cylinder 6 of the invention is provided on its inner peripheral surface with elongated ribs molded integrally therewith. These ribs are tangent to rod 1 in the vicinity of its middle portion and are long enough to prevent any transverse movement of the rod. Moreover, each rib has a small width (transverse dimension), the ratio between the width of a rib and the circumference of the rod being less than 10:100, and preferably equal to about 6:100. It is thereby possible to avoid an over-voltage drop, a phenomenon which takes place when the contact surface in the vicinity of the middle portion of the rod becomes too large. Such a fixation mode also makes the magnetostrictive rod immune to impacts and vibrations. As an example, with a ferrite rod having a length of 21,6 cm and a diameter of 2,5 cm, ribs of a length of 5 mm, a width of 0,5 mm and a thickness of 0,10 mm have proved satisfactory. The number of ribs 7 arranged about the rod is, in the example shown, 3. Ribs 7 are regularly distributed inside the spool according to FIG. 2, thus forming with each other an angle of 120°. However, a higher number of ribs is not to be excluded.

In order to fix the relative positions of the rod and the magnets 3, the spool 6 comprises locations 8 for accommodating the permanent magnets 3, on either side of the location provided for the field coil 2. The locations 8 are, in the example shown, rectangular in shape, the permanent magnets 3 being rectangular parallelepipeds.

Figure 3:
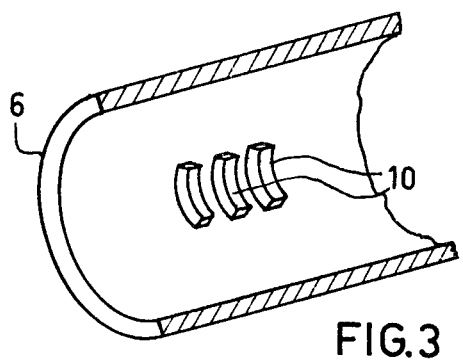
FIG. 3 shows an alternative embodiment.

A further embodiment according to the invention consists in making the ribs 7 not in a continuous form, but in a discontinuous form. FIG. 3 shows such an embodiment. Each rib is formed of a succession of blades of small thickness, also molded integrally with spool 6, parallel to each other, spaced apart by a small distance and perpendicular to the generatrices of rod 1. Such a fixation mode allows the contact surface of the rod 1 with ribs 7 to be reduced while ensuring a resilient positioning of the rod.

Figure 4:
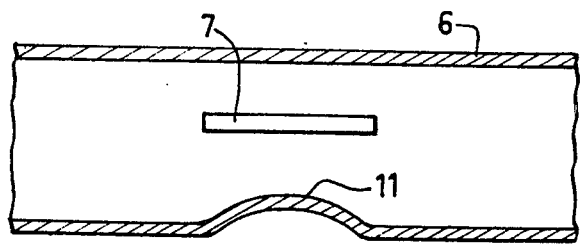
FIG. 4 shows a further alternative embodiment.

It is also possible, according to the modification of FIG. 4, to provide continuous ribs 7, for instance three ribs regularly spaced apart inside spool 6, and to replace one of them by a protrusion 11 formed in the spool. Such a protrusion 11 can be molded in the spool 6 and disposed like the ribs 7 at the middle of the filter. Such an embodiment provides a constant pressure on the filter knot, the two other ribs providing then and alone the longitudinal guiding of the rod.

The fixation means according to the invention applies more particularly to electric filter transducers.

Such a fixation means allows more particularly the centering of the rod in spool 6 to be optically examined after mounting the filter, by checking the distribution of the light transmitted around the rod.

What is claimed is:

1. A magnetostrictive mechanical filter comprising at least one rod of a magnetostrictive material forming a resonance element, a spool surrounding the rod, a field coil the windings of which are wound around the spool, and magnets creating a continuous magnetic field, arranged respectively at the ends of the rod, the rod being held radially in at least three points disposed regularly about the rod in the vicinity of the middle portion thereof, a rib being provided at each fixation point, said rib extending parallel to the generatrices of the rod and being formed on the inner peripheral surface of the spool and integrally molded with said spool.

2. A mechanical filter according to claim 1, wherein the contact surface of each rib with the rod has a width less than 1/10 of the rod circumference.

3. A mechanical filter according to either claim 1 or claim 2, wherein the spool comprises at both ends thereof locations for receiving the magnets.

4. A mechanical filter according to either claim 1 or claim 2, wherein the ribs are made of a series of blades of small thickness, parallel to each other and perpendicular to one of the generatrices of said rod.

* * * * *